United States Patent
Hirai et al.

(10) Patent No.: US 10,059,101 B2
(45) Date of Patent: Aug. 28, 2018

(54) LIQUID EJECTION HEAD AND LIQUID EJECTION APPARATUS

(71) Applicant: Seiko Epson Corporation, Tokyo (JP)

(72) Inventors: Eiju Hirai, Okaya (JP); Shiro Yazaki, Chino (JP); Koji Sumi, Shiojiri (JP); Motoki Takabe, Matsumoto (JP); Jiro Kato, Suwa (JP); Hiroshi Ito, Suwa (JP); Toshihiro Shimizu, Fujimi (JP); Takahiro Kamijo, Matsumoto (JP); Tatsuro Torimoto, Matsumoto (JP); Chikara Kojima, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/296,404

(22) Filed: Oct. 18, 2016

(65) Prior Publication Data

US 2017/0036446 A1 Feb. 9, 2017

Related U.S. Application Data

(60) Continuation of application No. 14/941,929, filed on Nov. 16, 2015, now Pat. No. 9,498,952, and a
(Continued)

(30) Foreign Application Priority Data

Feb. 1, 2012 (JP) ................................. 2012-019569

(51) Int. Cl.
*B41J 2/14* (2006.01)
*B41J 2/045* (2006.01)
(Continued)

(52) U.S. Cl.
CPC ........... *B41J 2/14233* (2013.01); *B41J 2/045* (2013.01); *B41J 2/14201* (2013.01); *B41J 2/161* (2013.01);
(Continued)

(58) Field of Classification Search
None
See application file for complete search history.

(56) References Cited

U.S. PATENT DOCUMENTS 6,616,270 B1 9/2003 Miyata et al.
2003/0193268 A1 10/2003 Junhua
(Continued)

FOREIGN PATENT DOCUMENTS

EP 0 875 380 A2 11/1998
JP 2007-258727 A 10/2007
(Continued)

OTHER PUBLICATIONS

IP.com search.*
Extended European Search Report for Application No. EP 13 15 3508 dated Apr. 23, 2013 (7 pages).

*Primary Examiner* — Lisa M Solomon
(74) *Attorney, Agent, or Firm* — Harness, Dickey & Pierce, P.L.C.

(57) ABSTRACT

A liquid ejection head includes a substrate in which a pressure generating chamber that communicates with a nozzle opening is formed; and a piezoelectric element having a piezoelectric layer, a first electrode that is formed on a surface of the piezoelectric layer on a side of the substrate so as to correspond to the pressure generating chamber, and a second electrode that is formed on a surface of the piezoelectric layer opposite to the side on which the first electrode is formed so as to extend over a plurality of the pressure generating chambers, wherein the second electrode is formed to extend to an outside of the pressure generating chamber in a longitudinal direction of the pressure generating chamber.

18 Claims, 9 Drawing Sheets

Related U.S. Application Data division of application No. 14/839,070, filed on Aug. 28, 2015, now abandoned, which is a continuation of application No. 14/565,942, filed on Dec. 10, 2014, now Pat. No. 9,144,977, which is a division of application No. 14/244,250, filed on Apr. 3, 2014, now abandoned, which is a continuation of application No. 13/755,342, filed on Jan. 31, 2013, now Pat. No. 8,727,510.

(51) Int. Cl.
*B41J 2/16* (2006.01)
*H01L 41/08* (2006.01)
*H01L 41/047* (2006.01)

(52) U.S. Cl.
CPC ........... *B41J 2/1626* (2013.01); *B41J 2/1631* (2013.01); *B41J 2/1646* (2013.01); *H01L 41/0471* (2013.01); *H01L 41/0805* (2013.01); *B41J 2/14274* (2013.01); *B41J 2002/14258* (2013.01); *B41J 2002/14491* (2013.01)

(56) References Cited

U.S. PATENT DOCUMENTS

| | | |
|---|---|---|
| 2004/0004413 A1 | 1/2004 | Junhua et al. |
| 2004/0108790 A1 | 6/2004 | Junhua et al. |
| 2009/0219345 A1 | 9/2009 | Yazaki et al. |
| 2009/0219347 A1 | 9/2009 | Sugahara |
| 2009/0284568 A1 | 11/2009 | Yazaki |
| 2011/0050808 A1 | 3/2011 | Cruz-Uribe et al. |
| 2011/0193916 A1 | 8/2011 | Hirai et al. |
| 2011/0221832 A1 | 9/2011 | Shimada |
| 2011/0234707 A1* | 9/2011 | Gao .................. B41J 2/14233 347/70 |

FOREIGN PATENT DOCUMENTS

| | | |
|---|---|---|
| JP | 2009-172878 A | 8/2009 |
| JP | 2009-196329 A | 9/2009 |

\* cited by examiner

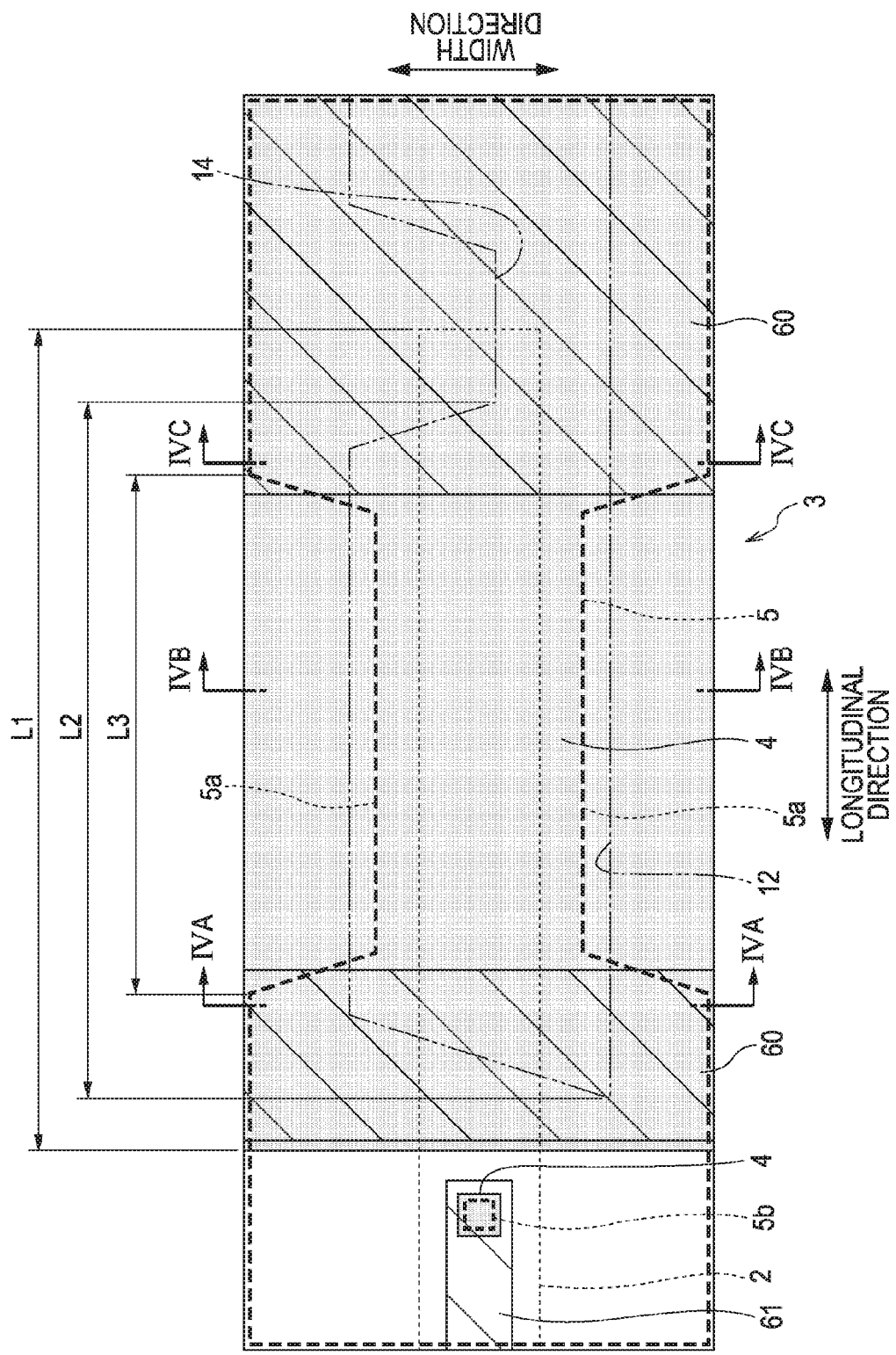

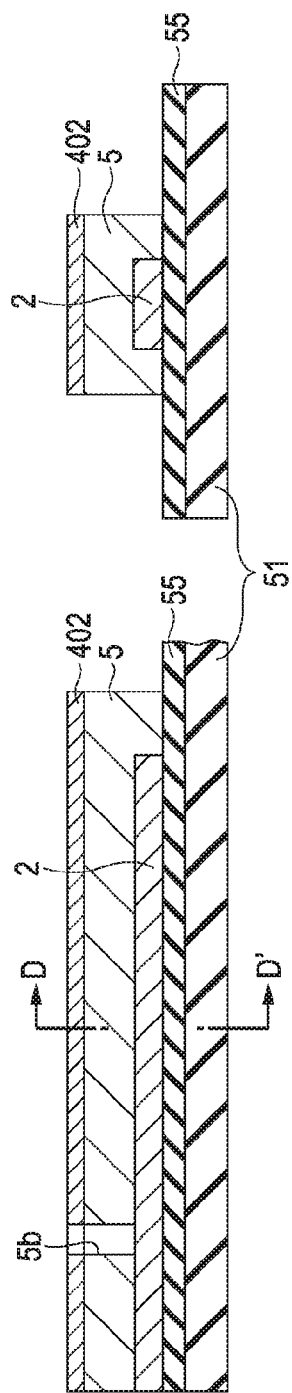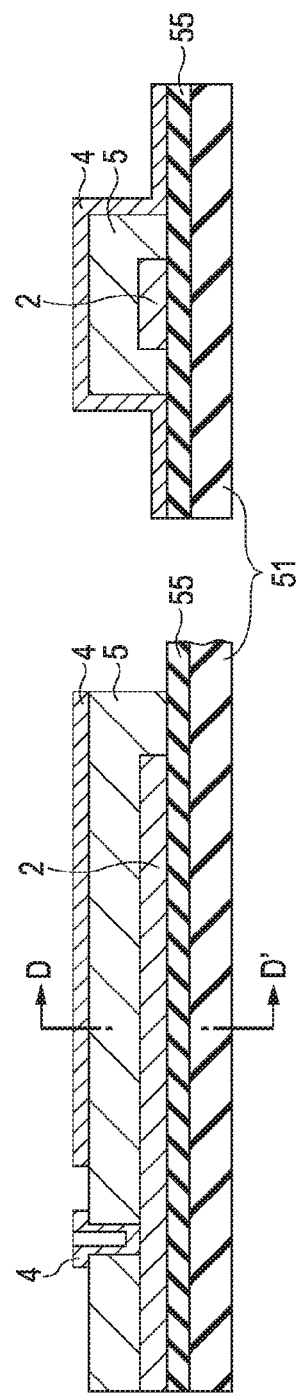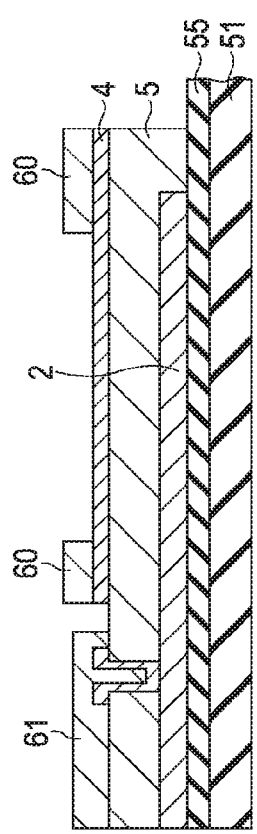
FIG. 6A
FIG. 6B
FIG. 6C

LIQUID EJECTION HEAD AND LIQUID EJECTION APPARATUS

CROSS-REFERENCE TO RELATED APPLICATIONS

This is a continuation patent application of U.S. application Ser. No. 14/941,929 filed Nov. 16, 2015, which is a divisional patent application of U.S. application Ser. No. 14/839,070, filed on Aug. 28, 2015, now abandoned, which is a continuation patent application of U.S. application Ser. No. 14/565,942, filed on Dec. 10, 2014, now U.S. Pat. No. 9,144,977, issued on Sep. 29, 2015, which is a divisional patent application of U.S. application Ser. No. 14/244,250, filed on Apr. 3, 2014, now abandoned, which is a continuation patent application of U.S. application Ser. No. 13/755,342, filed on Jan. 31, 2013, now U.S. Pat. No. 8,727,510, issued on May 20, 2014, which claims priority to Japanese Patent Application No. 2012-019569, filed on Feb. 1, 2012, all of which are incorporated by reference herein in their entireties.

BACKGROUND

1. Technical Field

The present invention relates to liquid ejection heads and liquid ejection apparatuses.

2. Related Art

JP-A-2009-172878 and JP-A-2009-196329 disclose a liquid ejection head including a substrate in which a pressure generating chamber that communicates with a nozzle opening for ejecting liquid is formed, and a piezoelectric element having a piezoelectric layer, a lower electrode that is formed on the lower side of the piezoelectric layer and an upper electrode that is formed on the upper side of the piezoelectric layer. In such a liquid ejection head, the lower electrode is provided as an individual electrode that corresponds to each of the pressure generating chambers, and the upper electrode is provided as a common electrode for a plurality of piezoelectric elements that correspond to a plurality of pressure generating chambers.

The above-mentioned piezoelectric element displaces when a voltage is applied across both electrodes and flexes into the pressure generating chamber. During flexing, a significant amount of stress is generated at the interface between an area on the piezoelectric element where the upper electrode, the piezoelectric layer and the lower electrode overlap (active section) and an area other than the active section (inactive section), which causes distortion to be concentrated at this position. Since concentration of distortion may cause a problem such as crack in the piezoelectric layer that forms the piezoelectric element, it has been required to prevent such a problem. Further, in addition to prevention of the above-mentioned problem, it has been also required to increase the amount of liquid to be output (ejected) from the pressure generating chamber to the outside of the nozzle opening by using deformation of the vibration plate in response to flexing of the piezoelectric element, thereby improving performance of the liquid ejection head.

SUMMARY

An advantage of some aspects of the invention is that a liquid ejection head capable of preventing or reducing a problem such as cracking in a piezoelectric layer and increasing the amount of liquid to be ejected, and a liquid ejection apparatus having the same are provided.

According to an aspect of the invention, a liquid ejection head includes: a substrate in which a pressure generating chamber that communicates with a nozzle opening is formed; and a piezoelectric element having a piezoelectric layer, a first electrode that is formed on a surface of the piezoelectric layer on a side of the substrate so as to correspond to the pressure generating chamber, and a second electrode that is formed on a surface of the piezoelectric layer opposite to the side on which the first electrode is formed so as to extend over a plurality of the pressure generating chambers, wherein the second electrode is formed to extend to an outside of the pressure generating chamber in a longitudinal direction of the pressure generating chamber. With this configuration, the second electrode is formed to extend to the outside of the pressure generating chamber in the longitudinal direction of the pressure generating chamber. Accordingly, concentration of distortion at the interface on the piezoelectric element is reduced compared to the case in which the second electrode is formed not to extend to the outside of the pressure generating chamber in the longitudinal direction, thereby reducing a problem such as cracking. Further, since the resistance to cracking of the piezoelectric element is improved, voltage resistance to the piezoelectric element is also improved.

According to an aspect of the invention, an area where the first electrode, the piezoelectric layer and the second electrode overlap may be formed to extend to an outside of the pressure generating chamber in the longitudinal direction. That is, since the area where the first electrode, the piezoelectric layer and the second electrode overlap (active section) is an area which drives when a voltage is applied, concentration of distortion at the interface on the piezoelectric element is reduced by providing the active section to extend to the outside of the pressure generating chamber in the longitudinal direction, thereby reducing a problem such as cracking.

According to an aspect of the invention, an opening is formed on the piezoelectric layer by removing the piezoelectric layer at a position that substantially corresponds to an area between the pressure generating chambers, and the opening may be formed to extend to an outside of the pressure generating chamber in the longitudinal direction. With this configuration, since the opening is formed to extend to the outside of the pressure generating chamber in the longitudinal direction, a displacement amount of the piezoelectric element at the end portions of the pressure generating chamber increases, which results in increased amount of liquid ejected by flexing of the piezoelectric element.

According to an aspect of the invention, a metal layer that is disposed on the second electrode and serves as a wiring may be formed to extend to both inside and outside of the pressure generating chamber. With this configuration, since the metal layer is formed to extend to both inside and outside of the pressure generating chamber, concentration of distortion at the interface on the piezoelectric element is further reduced, thereby reducing a problem such as cracking.

The technical concept of the invention is not limited to the form of liquid ejection head, and for example, a liquid ejection apparatus having the liquid ejection head in any of the aspects described above may be regarded as one aspect of the invention. Further, a manufacturing method including a manufacturing step of piezoelectric element, liquid ejection head and liquid ejection apparatus in any of the aspects described above (for example, a manufacturing method of piezoelectric element, manufacturing method of liquid ejection head and manufacturing method of liquid ejection apparatus) may be regarded as one aspect of the invention.

BRIEF DESCRIPTION OF THE DRAWINGS

The invention will now be described by way of example only with reference to the accompanying drawings, wherein like numbers reference like elements.

FIG. 3 is a plan view of an area on a substrate.

FIGS. 6A, 6B and 6C are views which show part of manufacturing steps of a piezoelectric element in sequence.

DESCRIPTION OF EXEMPLARY EMBODIMENTS

1. General Configuration of Liquid Ejection Head

Figure 1:
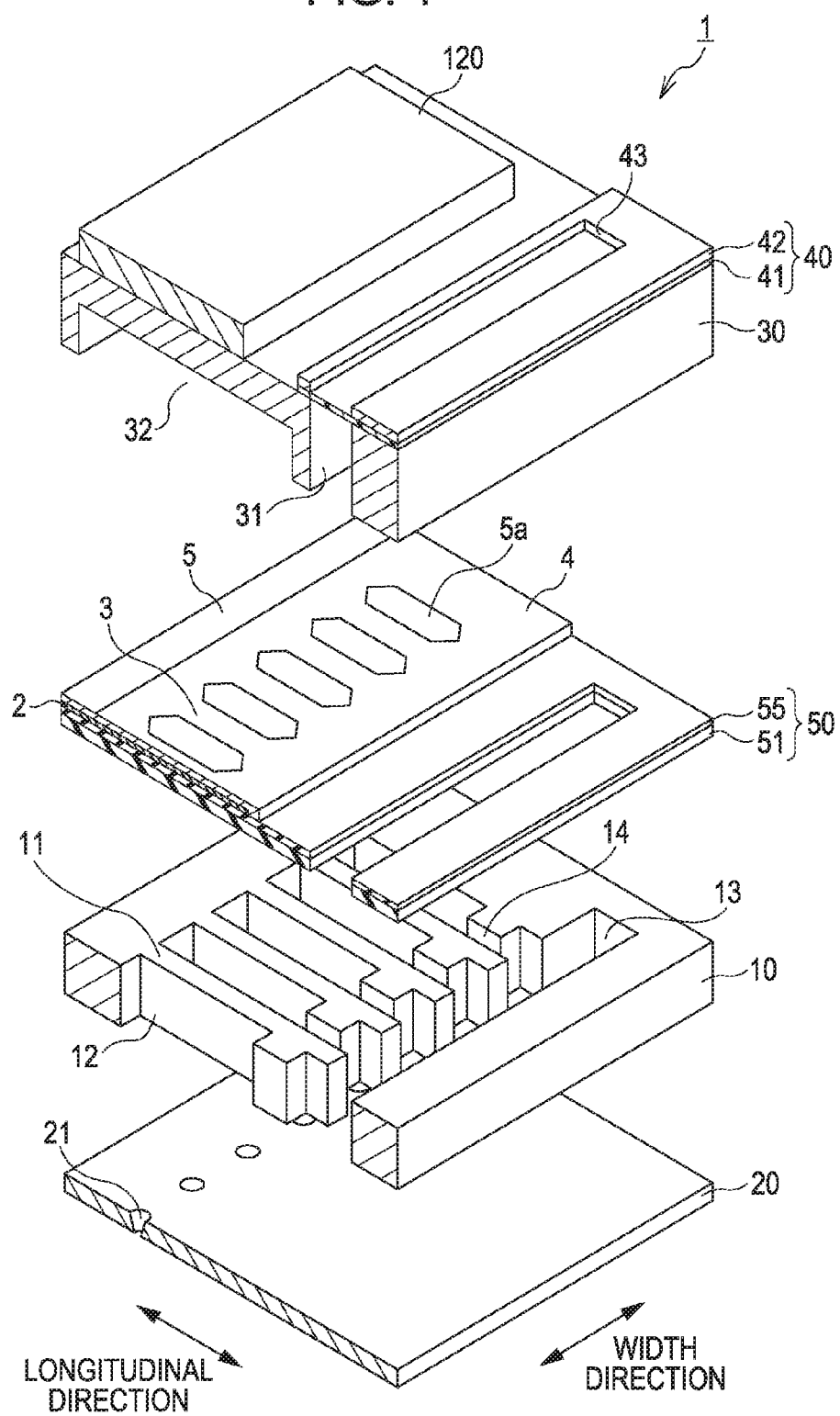
FIG. 1 is an exploded perspective view which schematically shows a recording head.
Figure 2:
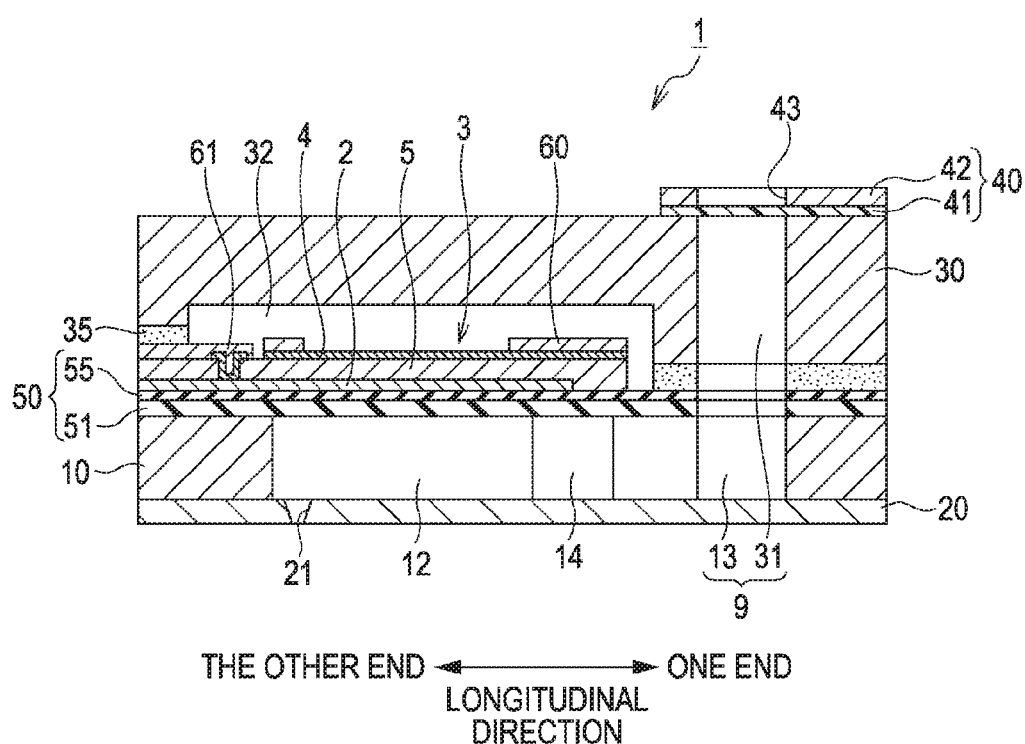
FIG. 2 is a sectional view of the recording head in a plane parallel to the longitudinal direction.

An embodiment of the invention will be described below with reference to the drawings. FIG. 1 is an exploded perspective view which schematically shows an ink jet recording head 1 (hereinafter, referred to as recording head 1) which is an example of liquid ejection head. FIG. 2 is a vertical sectional view of the recording head 1 in a plane parallel to the longitudinal direction of a pressure generating chambers 12 and passing through a lower electrode film 2 that corresponds to one of the pressure generating chambers 12. The recording head 1 includes a substrate (flow path forming substrate) 10. The substrate 10 is formed of, for example, a silicon single crystal substrate with a vibration plate 50 disposed on one side thereof. The vibration plate 50 includes, for example, an elastic film 51 formed of an oxide film that is in contact with the substrate 10, and an insulator film 55 formed of an oxide film made of a material different from that of the elastic film 51 and stacked on the elastic film 51. A plurality of pressure generating chambers 12 that are separated by dividing walls 11 are arranged side by side in the short direction (width direction) thereof on the substrate 10, and one side of the pressure generating chambers 12 are closed by the vibration plate 50.

In the substrate 10, ink supply paths 14 that are separated by the dividing walls 11 and communicate with the respective pressure generating chambers 12 are formed at one end of the pressure generating chambers 12 in the longitudinal direction. Further, a communication section 13 that communicates with the respective ink supply paths 14 is formed on the outer side of the ink supply paths 14. The communication section 13 communicates with a reservoir section 31 of a protective substrate 30, which will be described later, so as to form part of a reservoir 9 that serves as an ink chamber (liquid chamber) for all the pressure generating chambers 12.

Each ink supply path 14 has a cross sectional area in the width direction smaller than that of the pressure generating chamber 12 so as to keep a flow path resistance of ink that is introduced from the communication section 13 into the pressure generating chambers 12 to be constant. Although the ink supply path 14 is narrower in the width direction thereof, instead or as well it may be thinner in the thickness direction of the substrate 10 so as to have a cross sectional area smaller than that of the pressure generating chamber 12. The material of the substrate 10 is not limited to a silicon single crystal substrate, and may include a glass ceramic material, stainless steel, etc.

A nozzles plate 20 is secured by using an adhesive, a heat adhesive film or the like on the surface of the substrate 10 opposite to the side on which the vibration plate 50 is disposed. Nozzle openings 21 that correspond to the respective pressure generating chambers 12 are formed on the nozzles plate 20 by drilling at positions adjacent to the other end of the pressure generating chambers 12 in the longitudinal direction. The nozzles plate 20 is formed of, for example, a glass ceramic material, silicon single crystal substrate, stainless steel, etc.

A plurality of piezoelectric elements 3 having the lower electrode film 2, a piezoelectric layer 5 and an upper electrode film 4 are formed on the surface of the vibration plate 50 opposite to the side of the substrate 10 and arranged side by side in the width direction thereof. The piezoelectric elements 3 are formed so as to correspond to the respective pressure generating chambers 12. The lower electrode film 2 is defined as a first electrode which is formed on the surface of the piezoelectric layer 5 on the side of the substrate 10 and corresponds to each of the pressure generating chambers 12. On the other hand, the upper electrode film 4 is defined as a second electrode which is formed on the surface of the piezoelectric layer 5 opposite to the side on which the first electrode of the piezoelectric layer 5 is formed and extends across an area that corresponds to the plurality of pressure generating chambers 12. The piezoelectric element 3 includes an area (active section) where the lower electrode film 2, the piezoelectric layer 5 and the upper electrode film 4 overlap. Further, the piezoelectric element 3 and the vibration plate 50 that is displaced by driving the piezoelectric element 3 are collectively defined as an actuator device. Generally, in the piezoelectric element 3, one of the electrodes disposed on each side of the piezoelectric layer 5 is configured as a common electrode, and the other is configured as an individual electrode. In this embodiment, the lower electrode film 2 serves as the individual electrode for each of the piezoelectric elements 3 that correspond to the respective pressure generating chambers 12, and the upper electrode film 4 serves as the common electrode for all the pressure generating chambers 12 that correspond to the piezoelectric element 3.

As shown in FIG. 1, a plurality of recesses are formed as openings 5a in the piezoelectric layer 5 by removing the piezoelectric layer 5. The plurality of openings 5a are arranged side by side in the width direction thereof and are formed at positions that substantially correspond to between each of the pressure generating chambers 12. In other words, each of the piezoelectric elements 3 including the active section are formed between the openings 5a so as to correspond to each of the pressure generating chambers 12. The surface of the openings 5a are covered by the upper electrode film 4.

The protective substrate 30 with a compliance substrate 40 being secured thereon is mounted on the surface of the vibration plate 50 on which the piezoelectric elements 3 are formed. In this embodiment, description will be appropriately made taking the side of the compliance substrate 40 in the recording head 1 as the upper side, and the side of the nozzles plate 20 as the lower side for reference purposes of only. The protective substrate 30 including a piezoelectric element holding section 32 is attached by using an adhesive 35 on the surface of the vibration plate 50 on which the piezoelectric elements 3 are formed. The piezoelectric element holding section 32 is positioned so as to oppose the piezoelectric elements 3 and has an inner space that is sized so as not to interfere with the movement of the piezoelectric elements 3. Since the piezoelectric elements 3 are disposed inside the piezoelectric element holding section 32, they are substantially protected from the outside environment. Further, the protective substrate 30 also includes the reservoir section 31 formed at a position that corresponds to the communication section 13 of the substrate 10. The reservoir section 31, for example, penetrates through the protective substrate 30 in the thickness direction and extends in the width direction of the pressure generating chambers 12, and accordingly, communicates with the communication section 13 of the substrate 10 as described above, thereby forming a reservoir 9. Although the material of the protective substrate 30 may include a glass, ceramics material, metal, resin etc., it is preferable to be a material having substantially the same thermal expansion rate as that of the substrate 10. In this embodiment, the protective substrate 30 is formed of a silicon single crystalline substrate, which is the same material as that of the substrate 10.

As shown in FIG. 2, a lead electrode 60 is connected to the upper electrode film 4 which is the common electrode, while a lead electrode 61 is connected to the lower electrode film 2 which is the individual electrode. The lead electrodes 60, 61 and a through hole 5b (which will be described later) that extends through the piezoelectric layer 5 for connecting the lead electrode 61 to the lower electrode film 2 are not shown in FIG. 1. The lead electrodes 60, 61 are connected to a drive circuit 120 (FIG. 1) on which a drive IC for driving the piezoelectric elements 3 and the like are mounted via leads, which are not shown in the figure. The lead electrode 60 is a metal layer disposed on the second electrode and serves as wirings. Although in the example shown in FIG. 2, the lead electrode 61 that is connected to the individual electrode is disposed on the other end in the longitudinal direction, the lead electrode 61 may be disposed on one side in the longitudinal direction.

Further, the compliance substrate 40 composed of a sealing film 41 and a fixation plate 42 is attached on the protective substrate 30. The sealing film 41 is made of a flexible material having a low rigidity, and one side of the reservoir section 31 is sealed by the sealing film 41. The fixation plate 42 is made of a rigid material such as a metal. Since an area of the fixation plate 42 which opposes the reservoir 9 is completely removed in the thickness direction to form an opening 43, one side of the reservoir 9 is sealed only by the flexible sealing film 41.

In the recording head 1, ink is introduced from an external ink supply unit, which is not shown in the figure. After ink fills the inside of the path from the reservoir 9 to the nozzle opening 21, a voltage is applied to each of the piezoelectric elements 3 that correspond to the pressure generating chambers 12 in response to recording signals from the drive IC so that the piezoelectric elements 3 are flexibly deformed. As a result, a pressure in the pressure generating chambers 12 increases, thereby allowing ink droplets (liquid) to be output (ejected) from the nozzle openings 21.

2. Range of the Active Section

Figure 4A:
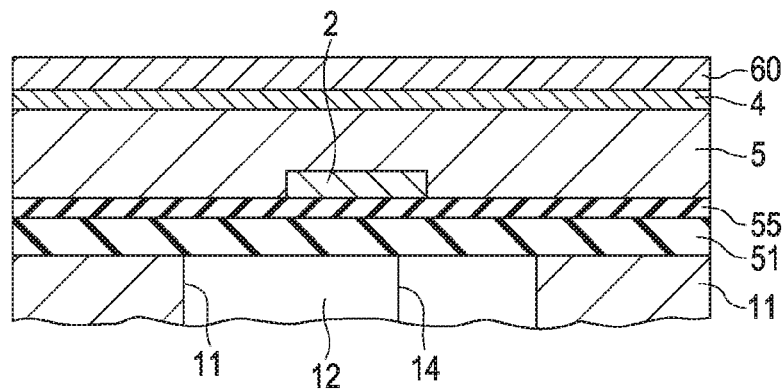
FIGS. 4A, 4B and 4C are sectional views taken along the respective lines of FIG. 3.
Figure 4B:
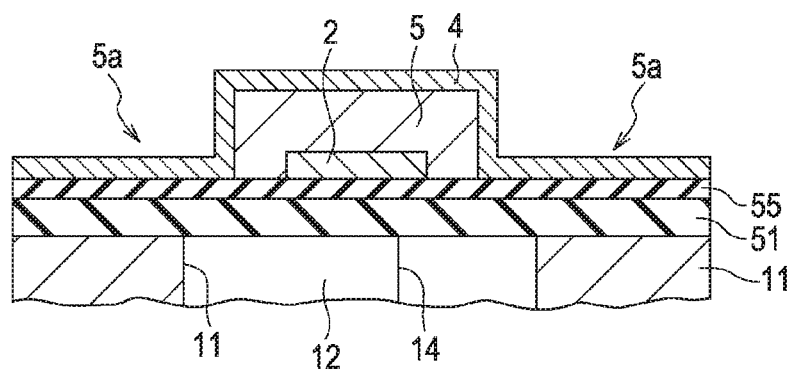
Figure 4C:
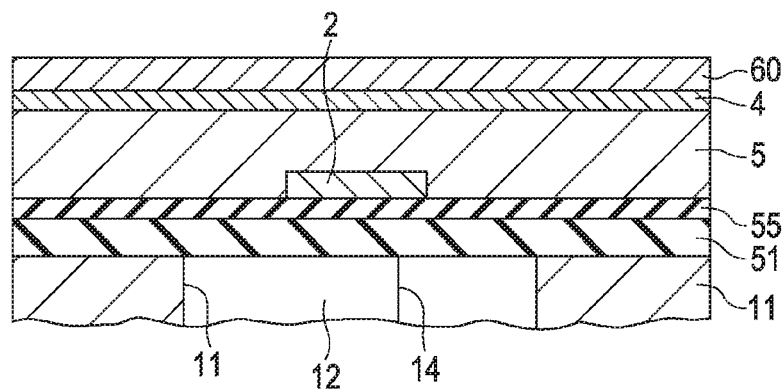

Next, a configuration of the piezoelectric element 3 is described in detail with further reference to FIGS. 1, 2 and also FIGS. 3, 4. FIG. 3 is a plan view of an area of the substrate 10 in which the piezoelectric element 3 that corresponds to one pressure generating chamber 12 is formed. FIG. 4A is a vertical sectional view taken along the line IVA-IVA of FIG. 3, FIG. 4B is a vertical sectional view taken along the line IVB-IVB of FIG. 3, and FIG. 4C is a vertical sectional view taken along the line IVC-IVC of FIG. 3.

The outline of the pressure generating chamber 12 and the ink supply path 14 that communicates with the pressure generating chamber 12 is illustrated in FIG. 3 by the dashed two dotted line. Although the outline of the pressure generating chamber 12 and the ink supply path 14 shown in FIG. 3 is slightly different from that of FIGS. 1 and 2, either may be employed. In FIG. 3, a range of the lower electrode film 2 as the individual electrode is indicated by the thin dotted line, a range of the piezoelectric layer 5 is indicated by the bold dotted line, and a range of the upper electrode film 4 as the common electrode is indicated by the gray-colored area. Further, in FIG. 3, a range of the lead electrode 60 that is partially stacked on the upper electrode film 4 and a range of lead electrode 61 that is partially stacked on the piezoelectric layer 5 are illustrated by hatching. The through hole 5b is formed on the piezoelectric layer 5 such that the lead electrode 61 is electrically connected to the lower electrode film 2 via the through hole 5b.

The lower electrode film 2 has a length in the width direction which is smaller than that of the pressure generating chambers 12 and a length in the longitudinal direction larger than the pressure generating chambers 12. Specifically, one end of the lower electrode film 2 in the longitudinal direction extends to the position of the ink supply paths 14, while the other end extends over the end of the pressure generating chambers 12. Further, the lower electrode film 2 is covered by the piezoelectric layer 5 except for a range that faces the through hole 5b. Accordingly, a leak current from the lower electrode film 2 can be reduced to a minimum, thereby eliminating a particular measure to reduce the leak current (for example, protection by using a protective film made of a material such as aluminum oxide).

The openings 5a are formed at positions that substantially correspond to part of the dividing walls 11 which are located on both sides of the pressure generating chambers 12 in the width direction. As shown in FIG. 4B, the openings 5a are formed by removing the piezoelectric layer 5. Since such openings 5a are formed, the piezoelectric layer 5 on the pressure generating chambers 12 is mostly included within the pressure generating chambers 12 in the width direction, while both ends of the piezoelectric layer 5 extend to the outside of the pressure generating chambers 12 in the longitudinal direction so as to completely cover the length of the pressure generating chambers 12. The upper electrode film 4 extend to the outside of the pressure generating chambers 12 both in the width direction and the longitudinal direction so as to completely cover the length of the pressure generating chambers 12. That is, in this embodiment, the active sections that correspond to the respective pressure generating chambers 12 extend to the outside of the pressure generating chambers 12 in the longitudinal direction. As shown in FIG. 3, the length of the active section in the longitudinal direction is defined as L1, and the length of the pressure generating chambers 12 in the longitudinal direction is defined as L2 such that L1 covers the range of L2.

The configurations of FIG. 3 are repeatedly disposed in the width direction on the substrate 10 (more specifically, on the insulator film 55) so as to correspond to the pressure generating chambers 12. Accordingly, the piezoelectric layer 5, the upper electrode film 4 and the lead electrode 60 are repeatedly disposed in the width direction (see FIG. 1 as appropriate). Further, two lead electrodes 60 of FIG. 3 (the lead electrode 60 as shown in FIG. 4A and the lead electrode 60 as shown in FIG. 4C) are connected to each other at a specified position, which is not shown in the figure, so as to form one common electrode.

In this embodiment, both ends of the active section in the longitudinal direction of the pressure generating chamber 12 are configured to extend to the outside of the pressure generating chamber 12. Accordingly, when the active section of the piezoelectric element 3 drives to flexibly deform the piezoelectric element 3, concentration of distortion at the interface between the active section and the inactive section of the piezoelectric element 3 is reduced compared to the case in which both ends of the active section in the longitudinal direction of the pressure generating chamber 12 are configured not to extend to the outside of the pressure generating chamber 12, thereby reducing a problem such as cracking of the piezoelectric layer 5. Further, since the resistance to cracking of the piezoelectric element 3 is improved, voltage resistance to the piezoelectric element 3 is also improved.

As seen from FIGS. 2 and 3, the lead electrode 60 of this embodiment extends on both the inside and outside of the pressure generating chamber 12 (across the end of the pressure generating chambers 12). With this arrangement of the lead electrode 60, concentration of distortion at the interface between the active section and the inactive section of the piezoelectric element 3 or at the proximity of both ends of the piezoelectric element 3 is reduced, thereby further effectively reducing a problem such as cracking.

The opening 5a serves to provide the active section with a spring property by reducing the thickness of the circumference of the active section. Accordingly, the size of the opening 5a significantly effects on the flexibility of the active section. In this embodiment, as seen from FIG. 3, a length L3 of the opening 5a in the longitudinal direction is within the length L2 of the pressure generating chambers 12. That is, both ends of the opening 5a in the longitudinal direction are located at the inner side of both ends of the pressure generating chambers 12. Accordingly, the piezoelectric layer 5 overlaps both ends of the pressure generating chambers 12 in the longitudinal direction, thereby increasing rigidity of the piezoelectric element 3 at the proximity of both ends of the pressure generating chambers 12. As a result, concentration of distortion at the interface between the active section and the inactive section of the piezoelectric element 3 or at the proximity of both ends of the piezoelectric element 3 is reduced, thereby further effectively reducing a problem such as cracking.

3. Manufacturing Method

Next, an example of manufacturing method of the recording head 1 according to this embodiment will be described below. FIGS. 5A, 5B, 5C and FIGS. 6A, 6B, 6C show manufacturing steps of the piezoelectric element 3 that constitutes the recording head 1 in sequence. FIGS. 5A, 5B, 5C and FIGS. 6A, 6B, 6C are combination of vertical sectional views as seen from the same view point as that of FIG. 2 in a plane parallel to the longitudinal direction and vertical sectional views taken along the line D-D' in the respective figures, showing progress in the manufacturing steps. In FIGS. 5A, 5B, 5C and FIGS. 6A, 6B, 6C, components other than those of the piezoelectric element 3, for example, the substrate 10 are not shown as appropriate. First, the elastic film 51 formed of silicon dioxide ($SiO_2$) and the insulator film 55 formed of zirconium oxide ($ZrO_2$) are formed on the silicon single crystal substrate (not shown in the figure) which is a material of the substrate 10 (for example, see JP-A-2005-8841). Then, a lower electrode film is formed by laminating platinum and iridium on the insulator film 55, for example, by a sputtering technique. After that, a thin piezoelectric layer is formed on the lower electrode film, for example, by a sol-gel process. The thin piezoelectric layer as used herein means that the piezoelectric layer has a thickness at least smaller than that of the piezoelectric layer 5 which is required in the resultant piezoelectric element 3.

Figure 5A:
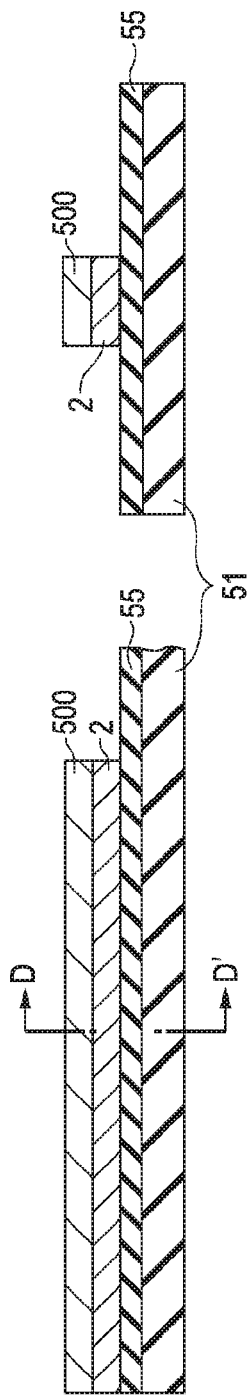
FIGS. 5A, 5B and 5C are views which show part of manufacturing steps of a piezoelectric element in sequence.
Figure 5B:
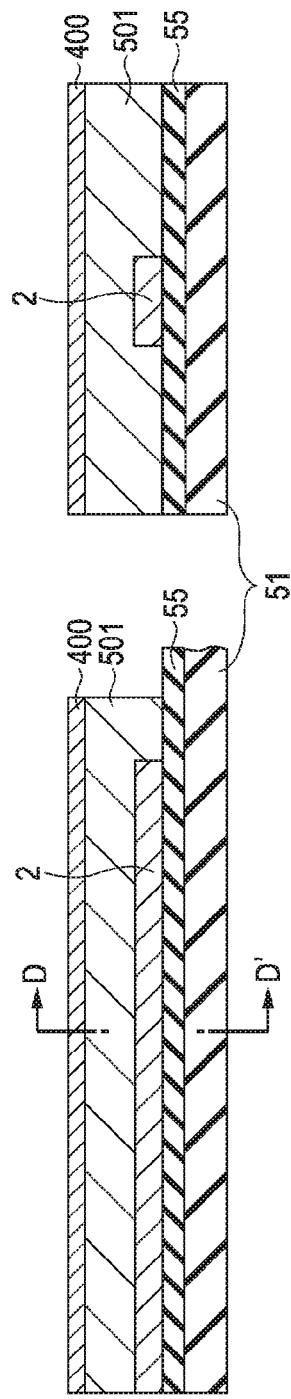

Then, photo-etching is performed on the lower electrode film and the piezoelectric layer to make patterning on the lower electrode film and the piezoelectric layer so as to form a specific pattern that corresponds to the respective positions where the pressure generating chambers 12 are to be formed. FIG. 5A shows the lower electrode film 2 and the piezoelectric layer 500 on the lower electrode film 2 that have been formed by the above-mentioned patterning. In the state shown in FIG. 5A, the piezoelectric layer is further formed to a thickness required in the resultant piezoelectric element 3, for example, by a sol-gel process, and then, a thin upper electrode film formed of iridium or the like is formed on the piezoelectric layer, for example, by a sputtering technique. The thin upper electrode film as used herein means that the upper electrode film has a thickness at least smaller than that of the upper electrode film 4 which is required in the resultant piezoelectric element 3. FIG. 5B shows the piezoelectric layer 501 and the upper electrode film 400 on the piezoelectric layer 501 that have been formed in the steps so far.

Figure 5C:
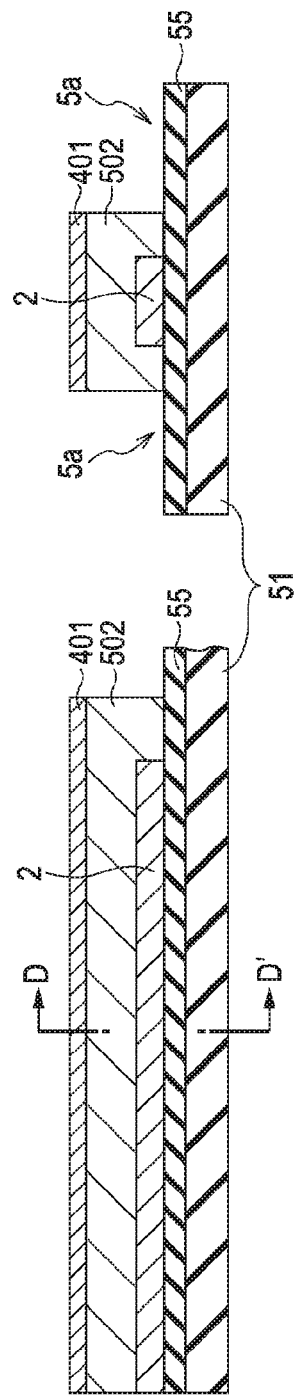

Then, in the state shown in FIG. 5B, photo-etching is performed on the upper electrode film 400 and the piezoelectric layer 501 to make patterning that leaves a specific thickness of the piezoelectric layer that covers the lower electrode film 2 and the upper electrode film on the piezoelectric layer. That is, a recess that corresponds to the opening 5a is formed. In this embodiment, etching of the piezoelectric layer for forming the opening 5a is referred to as "first etching process of the piezoelectric layer" as appropriate. FIG. 5C shows the piezoelectric layer 502 and the upper electrode film 401 on the piezoelectric layer 502 that have been formed in the steps so far.

Then, in the state shown in FIG. 5C, photo-etching is performed on the upper electrode film 401 and the piezoelectric layer 502 to form the through hole 5b that allows part of the lower electrode film 2 to be exposed. In this embodiment, etching of the piezoelectric layer for forming the through holes 5b is referred to as "second etching process of the piezoelectric layer" as appropriate. FIG. 6A shows the piezoelectric layer 5 and the upper electrode film 402 on the piezoelectric layer 5 that have been formed in the steps so far. As shown in FIG. 6A, the through hole 5b penetrates through the piezoelectric layer 5 and the upper electrode film 402. According to this embodiment, in the state subsequent to that shown in FIG. 5B, etching of the piezoelectric layer for forming the opening 5a and etching of the piezoelectric layer for forming the through hole 5b are separately performed, whose reason will be described later.

Then, in the state shown in FIG. 6A, the upper electrode film is further formed to a thickness required in the resultant piezoelectric element 3, for example, by a sputtering technique. After that, photo-etching is performed on the upper electrode film to make patterning on the upper electrode film so as to form a specific pattern that corresponds to the respective positions where the pressure generating chambers 12 are to be formed and a specific pattern that includes the range of the respective through holes (see FIG. 3). FIG. 6B shows the upper electrode film 4 that has been formed by the above-mentioned patterning. Then, in the state shown in FIG. 6B, a metal layer (for example, the metal layer including gold (Au) and Nichrome (NiCr)) which is a material of the lead electrodes 60, 61 is formed, for example, by a sputtering technique, and then, photo-etching is performed on the metal layer so as to form the lead electrodes 60, 61. The lead electrode 60 is connected to the upper electrode film 4. On the other hand, the lead electrode 61 is connected to the lower electrode film 2 via the through hole 5b and the upper electrode film 4 (FIG. 6B) formed on the surface of the through hole 5b. The upper electrode film 4 (FIG. 6B) formed on the surface of the through hole 5b serves as part of the wirings that connect the drive circuit 120 and the individual electrode (the lower electrode film 2).

FIG. 6C shows a configuration that has been formed in the steps so far. The configuration shown in FIG. 6C is consistent with the configuration of the piezoelectric element 3 shown in FIG. 2 and FIG. 3. Then, the recording head 1 is completed through the steps such as connecting of the protective substrate 30 on the side of the piezoelectric element 3, forming of the pressure generating chambers 12, the ink supply paths 14 and the like by etching the substrate 10, connecting of the nozzles plate 20 on the substrate 10, and connecting of the compliance substrate 40 on the protective substrate 30. It should be noted that the above-mentioned manufacturing method of the recording head 1 is merely an example, and various modifications are possible. The forming method of the piezoelectric layer is also not limited to that described above, and a sputtering technique may also be used. Further, the material of the piezoelectric layer may include various materials, for example, lead zirconate titanate based material and non-lead (lead-free) perovskite oxide such as barium titanate.

Then, the reason of the first etching process of the piezoelectric layer and the second etching process of the piezoelectric layer being separately provided in the above-mentioned manufacturing method will be described. When the piezoelectric layer 501 is formed so as to cover the lower electrode film 2 and the insulator film 55 around the lower electrode film 2 as shown in FIG. 5B, it is not always possible due to manufacturing accuracy to easily make the thickness of the piezoelectric layer 501 on the insulator film 55 and the thickness of the piezoelectric layer 501 on the lower electrode film 2 to be the same. Particularly, uneven thickness of those layers becomes significant when the piezoelectric layer is formed by using liquid, typically by a sol-gel process. Accordingly, the optimum etching amount of the piezoelectric layer 501 to expose the insulator film 55 (to form the opening 5a) is different from the optimum etching amount of the piezoelectric layer 501 to expose the lower electrode film 2 (to form the through hole 5b). If etching for exposing the insulator film 55 and etching for exposing the lower electrode film 2 are simultaneously performed, one of the insulator film 55 and the lower electrode film 2 may suffer from over etching (excessive etching) and the other may suffer from under etching (insufficient etching), since it is difficult to precisely control the etching amount at each location.

For example, when the thickness of the piezoelectric layer 501 on the insulator film 55 is greater than the thickness of the piezoelectric layer 501 on the lower electrode film 2 and etching of those layers are simultaneously performed, the lower electrode film 2 suffers from over etching during removing of the piezoelectric layer 501 on the insulator film 55, which may cause breakage of the lower electrode film 2. Further, in an attempt to prevent over etching of the lower electrode film 2, the insulator film 55 may fail to be exposed. Alternatively, when the thickness of the piezoelectric layer 501 on the insulator film 55 is smaller than the thickness of the piezoelectric layer 501 on the lower electrode film 2 and etching of those layers are simultaneously performed, the insulator film 55 suffers from over etching during removing of the piezoelectric layer 501 on the lower electrode film 2. As a result, the opening 5a is thinner than the required thickness and fails to obtain the required rigidity, which may cause cracking on the opening 5a. Further, in an attempt to prevent over etching of the insulator film 55, the lower electrode film 2 may fail to be exposed.

Therefore, in this embodiment, the first etching process of the piezoelectric layer and the second etching process of the piezoelectric layer are separately provided so that optimum etching amount of the piezoelectric layer is set to obtain the thickness for each area to be processed in each process. Accordingly, optimum etching of the piezoelectric layer 501 to form the opening 5a and optimum etching of the piezoelectric layer 501 to form the through hole 5b can be achieved, thereby preventing the above-mentioned over etching and under etching from occurred. The first etching process of the piezoelectric layer and the second etching process of the piezoelectric layer may be performed in the order opposite to that is described in the above description.

4. Modified Example

The invention is not limited to the above-mentioned embodiment and can be implemented in various embodiments within the scope of the invention without departing from its principle. For example, the following modified example can be implemented. Further, the various embodiments and modified examples which are combined as appropriate are also within the scope of the invention. In the following description, differences from the above-mentioned embodiment will be described, and configurations and effects which are the same as those of the above-mentioned embodiment will be omitted as appropriate.

Figure 7:
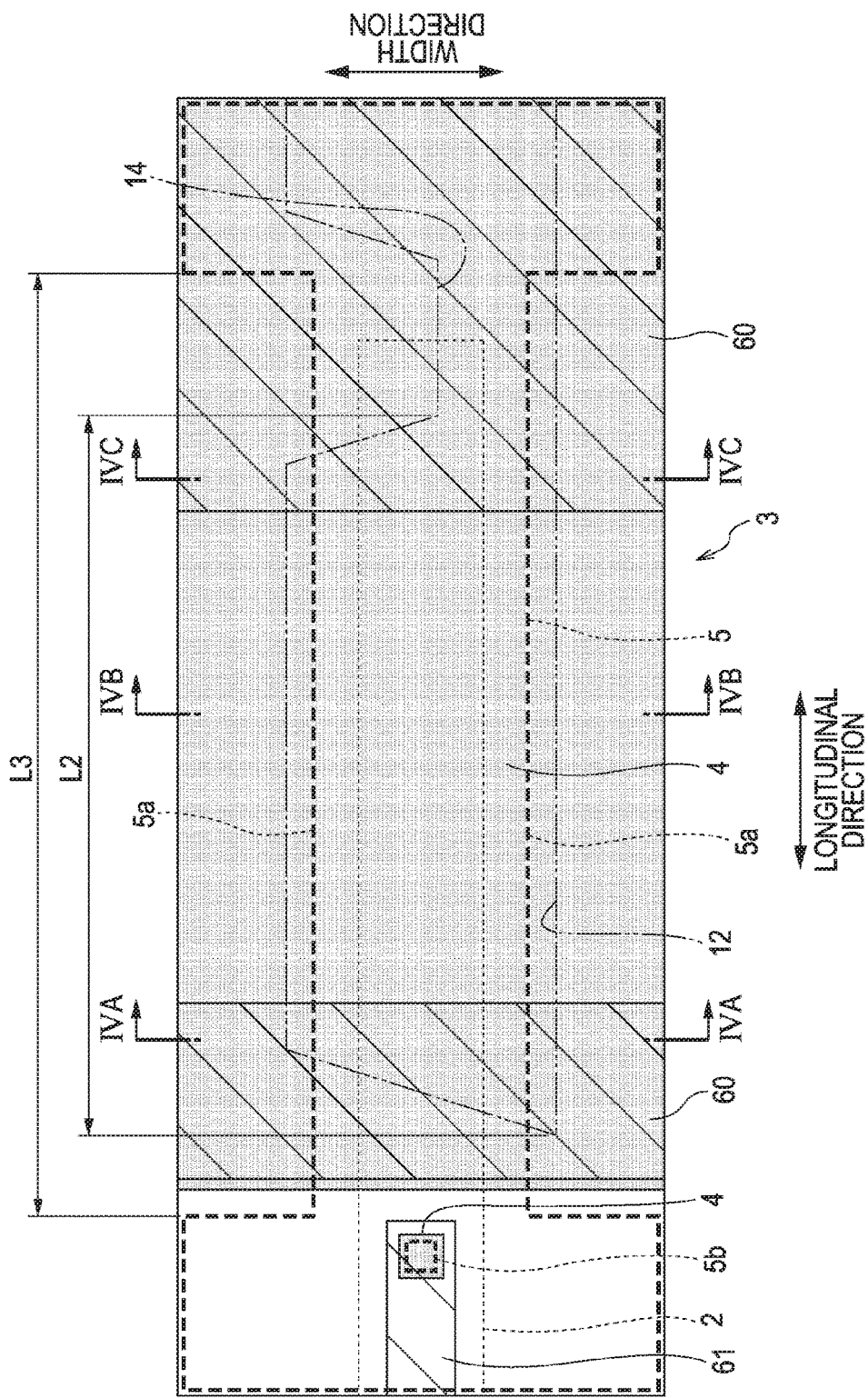
FIG. 7 is a plan view of an area on a substrate according to a modified example.

FIG. 7 is a plan view of an area on the substrate 10 according to a modified example, and similarly to FIG. 3, shows the area in which the piezoelectric element 3 that corresponds to one pressure generating chamber 12 is formed. The configuration of FIG. 7 and the configuration of FIG. 3 are different in that they have different lengths of the opening 5a in the longitudinal direction. Specifically, the opening 5a of FIG. 7 is longer than that of FIG. 3, and the opening 5a of FIG. 7 is formed to extend to the outside of the pressure generating chamber 12 in the longitudinal direction. That is, in FIG. 7, the length L3 of the opening 5a in the longitudinal direction is formed to include the length L2 of the pressure generating chamber 12. With this configuration, a rigidity of the piezoelectric element 3 at the proximity of both ends of the pressure generating chambers 12 in the longitudinal direction decreases, and a displacement amount of the piezoelectric element 3 at the proximity of both the pressure generating chamber 12 increases.

Figure 8:
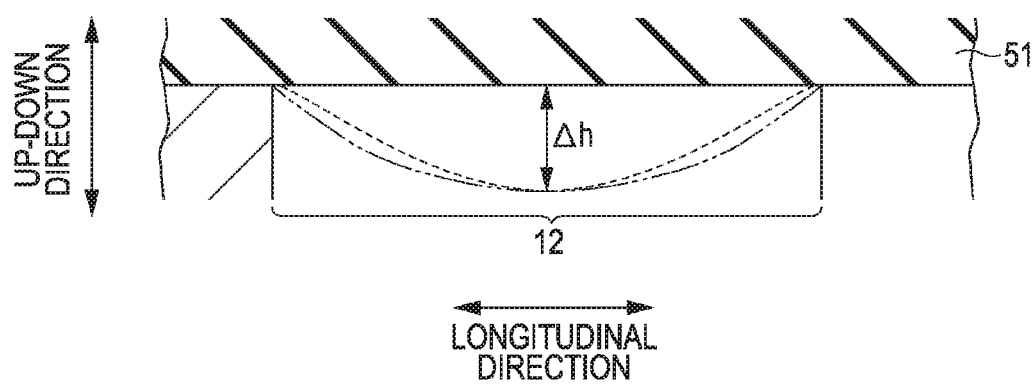
FIG. 8 is a view which explains an effect of the modified example.

FIG. 8 is a view which explains an effect of the modified example. FIG. 8 illustrates the positional relationship between the pressure generating chamber 12 in the longitudinal direction and the elastic film 51 that closes the upper portion of the pressure generating chamber 12 in a simplified manner. When a voltage is applied to the piezoelectric element 3 that is formed to correspond to the pressure generating chamber 12 to drive the active section, the active section displaces and the elastic film 51 flexes into the pressure generating chamber 12. The difference between the position before the elastic film 51 flexes (the position of the elastic film 51 indicated by the solid line in FIG. 8) and the position after the elastic film 51 flexes in the up-down direction is the displacement amount Δh. Further, in FIG. 8, the positions of the flexed elastic film is illustrated by the dotted line and the dashed two dotted line. The position indicated by the dotted line shows the position in a configuration in which the length L3 of the opening 5a is within the length L2 of the pressure generating chambers 12, while the position indicated by the dashed two dotted line shows the position in a configuration (configuration of FIG. 7) in which the length L3 of the opening 5a includes the length L2 of the pressure generating chamber 12.

As seen from FIG. 8, the displacement amounts Δh at the center of the pressure generating chamber 12 in the longitudinal direction is substantially the same regardless of the above-mentioned difference of the length L3 of the opening 5a. On the other hand, the displacement amounts Δh at the end portions of the pressure generating chambers 12 are different such that the displacement amounts Δh are larger in the configuration in which the length L3 of the opening 5a is longer than the length L2. When the displacement amounts Δh at the end portions of the pressure generating chambers 12 increases, the amount of liquid ejected by flexing of the piezoelectric element 3. That is, according to the modified example shown in FIG. 7, performance of the recording head 1 can be improved by increasing the amount of liquid ejected. Moreover, in the configuration shown in FIG. 7, a vertical sectional view taken along the line IVB-IVB is the same as that of FIG. 4B. Further, in a vertical sectional view taken along the line IVA-IVA and a vertical sectional view taken along the line IVC-IVC, the opening 5a is formed similarly to the vertical sectional view taken along the line IVB-IVB, and the upper electrode film 4 and the lead electrode 60 are disposed on the opening 5a.

5. Others

Figure 9:
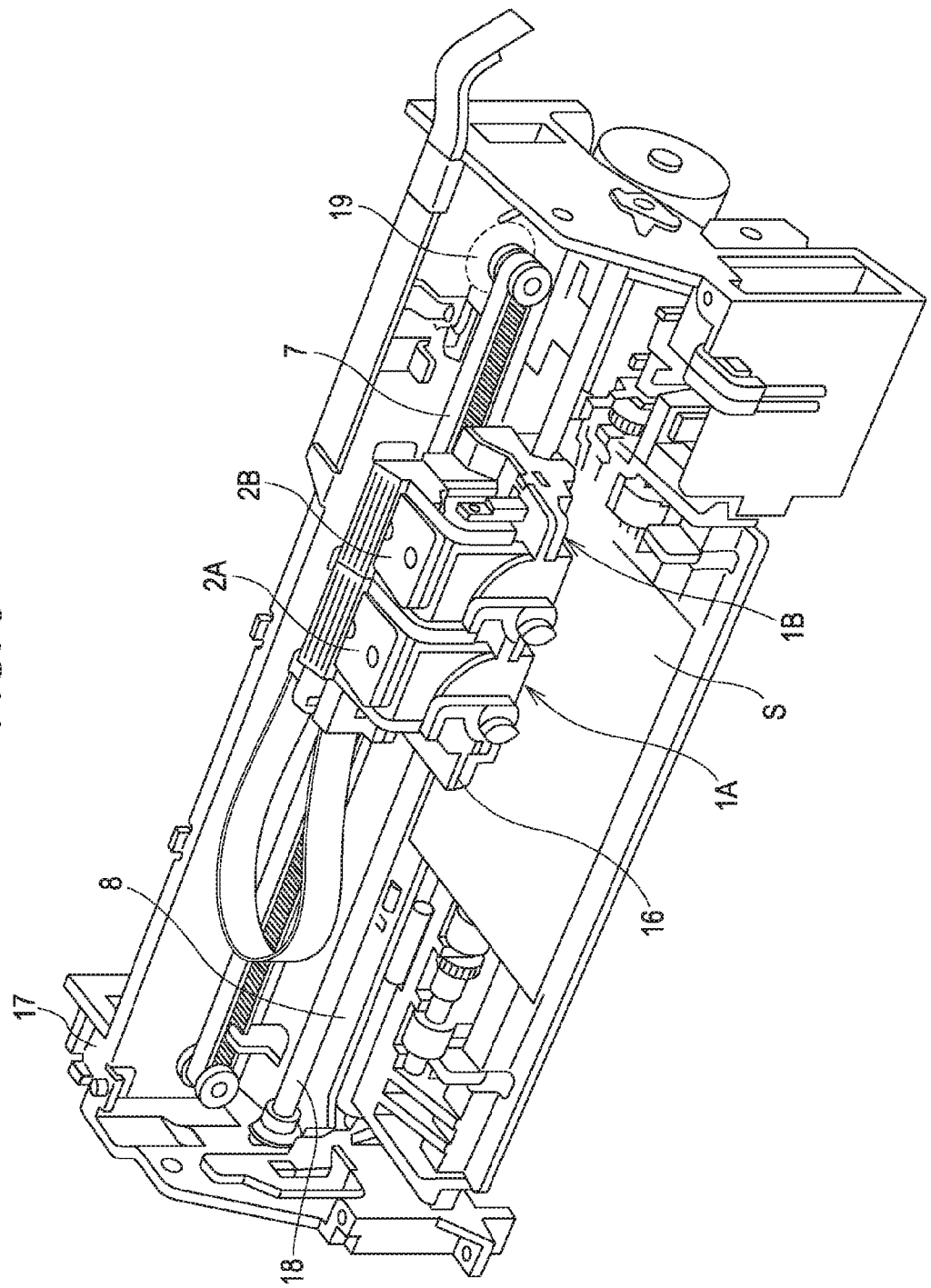
FIG. 9 is a schematic view of an example of an ink jet recording apparatus.

The above-mentioned recording head 1 constitutes part of a recording head unit having ink flow paths that communicate with the ink cartridge and the like and is mounted on an ink jet recording apparatus which is a liquid ejection apparatus. FIG. 9 is a schematic view of an example of the ink jet recording apparatus. As shown in FIG. 9, cartridges 2A, 2B that constitute the ink supply unit are detachably mounted on the recording head units 1A, 1B having a recording head. A carriage 16 on which the recording head units 1A, 1B are mounted is provided on a carriage shaft 18 that is formed on an apparatus body 17 so as to be movable along the carriage shaft 18. The recording head units 1A, 1B are configured to eject, for example, black ink composition and color ink composition, respectively. When a drive force from a drive motor 19 is transmitted to the carriage 16 via a plurality of gears (not shown in the figure) and a timing belt 7, the carriage 16 on which the recording head units 1A, 1B are mounted moves along the carriage shaft 18. Further, a platen 8 is provided along the carriage shaft 18 in the apparatus body 17 such that a recording sheet S which is a recording medium such as a sheet of paper fed by a feeding roller and the like, which are not shown in the figure, is transported on the platen 8.

Although the ink jet recording head has been described as an example of the liquid ejection head of the invention, the liquid ejection head is not limited thereto. The invention is generally directed to liquid ejection heads, and as a matter of course, can be applied to heads that ejects liquid other than ink. Other liquid ejection heads may include, for example, various recording heads used for image recording apparatuses such as printers, color material ejection heads used for manufacturing color filters for liquid crystal displays and the like, electrode material ejection heads used for manufacturing electrodes for organic electroluminescence (EL) displays, field emission displays (FEDs) and the like, and bioorganic ejection heads used for manufacturing biochips.

Further, the piezoelectric element of the invention is not limited to that used for the liquid ejection head, and can be used for other devices. Other devices may include, for example, ultrasonic devices such as ultrasonic transmitters, ultrasonic motors, temperature-electricity converters, pressure-electricity converters, ferroelectric transistors, piezoelectric transducers, block filters for harmful rays such as infrared ray, optical filters using photonic crystal effect by quantum dot structure, and optical filters using thin film light interference. Further, the invention is also applicable to piezoelectric elements used for sensors, and piezoelectric elements used for ferroelectric memories. Sensors that use a piezoelectric element may include, for example, infrared sensors, ultrasonic sensors, thermo-sensitive sensors, pressure sensors, pyroelectric sensors and gyro sensors (angular rate sensors).

What is claimed is:

1. A liquid ejecting head, comprising:
   a substrate defining a plurality of pressure generating chambers that each communicate with a respective nozzle opening, the pressure generating chambers each extending in a longitudinal direction; and
   a piezoelectric element having a piezoelectric layer that overlaps each of the pressure generating chambers, a first electrode film formed between the piezoelectric layer and the substrate and overlapping each of the pressure generating chambers, and a second electrode film formed on a surface of the piezoelectric layer opposite to the first electrode film and overlapping each of the pressure generating chambers,
   wherein overlap of the first electrode, the piezoelectric layer, and the second electrode defines an active section of the piezoelectric element;
   a plurality of openings are formed in the piezoelectric layer at locations between each of the pressure generating chambers; and
   a length of the active section in the longitudinal direction is L1, a length of each of the pressure generating chambers in the longitudinal direction is L2, a length of each of the openings in the longitudinal direction is L3, and L1>L2>L3 in a plan view.

2. The liquid ejecting head according to claim 1, wherein opposing ends of the each of the openings are located inside of opposing ends of each of the pressure generating chambers.

3. The liquid ejecting head according to claim 2, further comprising:

a metal layer disposed on the second electrode film that serves as a wiring, the metal layer overlapping an interior and an exterior of the pressure generating chamber.

4. The liquid ejecting head according to claim 2, wherein each of the openings have a hexagon shape in the plan view.

5. A liquid ejecting apparatus comprising the liquid ejecting head according to claim 2.

6. The liquid ejecting head according to claim 1, wherein opposing ends of the each of the openings are located outside of opposing ends of each of the pressure generating chambers.

7. The liquid ejecting head according to claim 6, further comprising:
a metal layer disposed on the second electrode film that serves as a wiring, the metal layer overlapping an interior and an exterior of the pressure generating chamber.

8. The liquid ejecting head according to claim 6, wherein each of the openings have a hexagon shape in the plan view.

9. A liquid ejecting apparatus comprising the liquid ejecting head according to claim 6.

10. A piezoelectric device, comprising:
a substrate defining a plurality of chambers that each communicate with a respective nozzle opening, the chambers each extending in a longitudinal direction; and
a piezoelectric element having a piezoelectric layer that overlaps each of the chambers, a first electrode film formed between the piezoelectric layer and the substrate and overlapping each of the chambers, and a second electrode film formed on a surface of the piezoelectric layer opposite to the first electrode film and overlapping each of the chambers,
wherein overlap of the first electrode, the piezoelectric layer, and the second electrode defines an active section of the piezoelectric element;
a plurality of openings are formed in the piezoelectric layer at locations between each of the chambers; and
a length of the active section in the longitudinal direction is L1, a length of each of the chambers in the longitudinal direction is L2, a length of each of the openings in the longitudinal direction is L3, and L1>L2>L3 in a plan view.

11. The piezoelectric device according to claim 10, wherein opposing ends of the each of the openings are located inside of opposing ends of each of the chambers.

12. The piezoelectric device according to claim 11, further comprising:
a metal layer disposed on the second electrode film that serves as a wiring, the metal layer overlapping an interior and an exterior of the chamber.

13. The piezoelectric device according to claim 11, wherein each of the openings have a hexagon shape in the plan view.

14. A piezoelectric apparatus comprising the piezoelectric device according to claim 11.

15. The piezoelectric device according to claim 10, wherein opposing ends of the each of the openings are located outside of opposing ends of each of the chambers.

16. The piezoelectric device according to claim 15, further comprising:
a metal layer disposed on the second electrode film that serves as a wiring, the metal layer overlapping an interior and an exterior of the chamber.

17. The piezoelectric device according to claim 15, wherein each of the openings have a hexagon shape in the plan view.

18. A piezoelectric apparatus comprising the piezoelectric device according to claim 15.

* * * * *